(12) United States Patent
Shapiro et al.

(10) Patent No.: US 11,049,855 B2
(45) Date of Patent: Jun. 29, 2021

(54) TUNABLE CAPACITIVE COMPENSATION FOR RF SWITCH FET STACKS

(71) Applicant: pSemi Corporation, San Diego, CA (US)

(72) Inventors: Eric S. Shapiro, San Diego, CA (US); Simon Edward Willard, Irvine, CA (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 71 days.

(21) Appl. No.: 16/059,978

(22) Filed: Aug. 9, 2018

(65) Prior Publication Data

US 2020/0051973 A1 Feb. 13, 2020

(51) Int. Cl.
*H01L 27/06* (2006.01)
*H01L 29/93* (2006.01)
*H01L 23/66* (2006.01)

(52) U.S. Cl.
CPC .......... *H01L 27/0629* (2013.01); *H01L 23/66* (2013.01); *H01L 29/93* (2013.01)

(58) Field of Classification Search
CPC ...... H01L 27/0629; H01L 23/66; H01L 29/93
See application file for complete search history.

(56) References Cited

U.S. PATENT DOCUMENTS

| | | | |
|---|---|---|---|
| 8,638,159 B2 | 1/2014 | Ranta et al. | |
| 9,595,956 B2 | 3/2017 | Englekirk | |
| 2016/0043698 A1* | 2/2016 | Banerjee | H03F 1/565 330/305 |
| 2017/0054412 A1* | 2/2017 | Valdes Garcia | H03B 5/1215 |
| 2017/0054434 A1* | 2/2017 | Chakrabarti | H03B 5/1265 |

* cited by examiner

*Primary Examiner* — Fernando L Toledo
*Assistant Examiner* — Neil R Prasad
(74) *Attorney, Agent, or Firm* — Jaquez Land Greenhaus LLP; Alessandro Steinfl, Esq.

(57) ABSTRACT

Overcoming parasitic capacitances in RF integrated circuits is a challenging problem. The disclosed methods and devices provide solution to such challenge. Devices based on tunable capacitive elements that can be implemented with switch RF stacks are also disclosed.

28 Claims, 11 Drawing Sheets

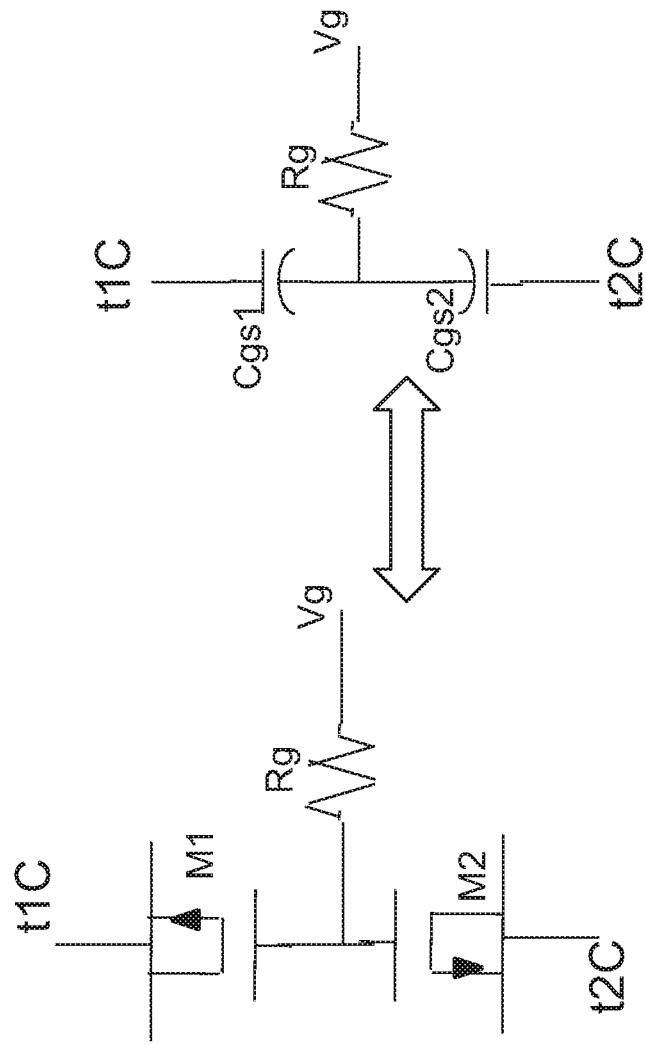
Fig. 3D
300D
Fig. 3C
300C
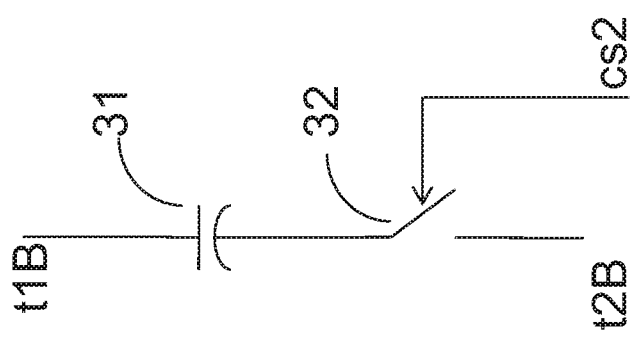
Fig. 3B
300B

TUNABLE CAPACITIVE COMPENSATION FOR RF SWITCH FET STACKS

CROSS-REFERENCE TO RELATED APPLICATIONS

The present application is related to U.S. Pat. No. 9,595,956 issued Mar. 14, 2017, entitled "Tuning Capacitance to Enhance FET Stack Voltage Withstand" incorporated herein by reference in its entirety. This application is also related to U.S. Pat. No. 8,638,159 issued Jan. 28, 2014, entitled "Device and Methods for Improving Voltage handling and/or Bi-directionality of Stacks of Elements when Connected Between Terminals", also incorporated herein by reference in its entirety.

BACKGROUND

(1) Technical Field

The present disclosure is related to compensation capacitors, and more particularly to methods and apparatus for tunable capacitive compensation of Radio Frequency (RF) switching stacks.

(2) Background

In some applications and as part of the design of Radio Frequency (RF) integrated circuits, RF switches are required to control connections between various elements of such circuits. One of the challenges of such design is that possible large RF voltages across drain-source of Field Effect Transistor (FET) switches may result in breakdown. This is why switches with stacked architecture are often used to increase the breakdown voltage of the overall switch. The idea is to divide the maximum RF swing among the constituent transistors of the switch stack and therefore, to avoid occasional breakdown of transistors due to large voltage amplitudes. One main challenge when designing switch stacks is the presence of parasitic capacitances which may cause severe uneven division of the RF swing among transistors of the stack. This issue may still cause breakdown regardless of the number of transistors used in the switch stack. Using capacitive compensation schemes is one way to overcome such issue.

FIG. 1 shows an RF circuit (100) including a switch stack (101) comprising transistors (T1, T2, T3, T4) and using capacitive compensation as disclosed in U.S. Pat. No. 9,595,956 incorporated herein by reference in its entirety. Capacitors cc1 and cc2 are compensation capacitors coupled across drain-source of the corresponding transistors T4 and T3. The capacitors cc1 and cc2 are hard-wired with fixed capacitance values designed to compensate the adverse effects of parasitic capacitances cp1, cp2 and cp3. The parasitic capacitances cp1, cp2 and cp3 may couple drains of respective transistors (T3, T2, T1) of the switch stack (101) to any other places in the RF circuit (100) including ground. This is represented by an arrow (102) as shown in FIG. 1. In accordance with the methods disclosed in the above-incorporated patent, the compensating capacitors cc1 and cc2 may be implemented by adding properly designed metal layers.

As known to the person skilled in the art, one of the main challenges when designing RF circuits such as the one shown in FIG. 1, is the difficulty of overcoming variable parasitic capacitances. As an example, in a dynamic environment wherein the RF circuit is surrounded by other switches or circuits, parasitic capacitances may vary due to changes in the states of nearby switches. A hard-wired capacitive compensation scheme is mostly specific to the package and/or flip chip environment parasitics and as such, it will not be effective enough to overcome issues associated with varying parasitic capacitances. Oftentimes, even if the parasitic capacitances are not changing during operative conditions, accurate prediction of such capacitances is a challenging task due to inherent complexity of the overall design of RF integrated circuits.

In view of the above, there is a need for methods and devices to tune or adjust the capacitive compensation for varying amounts of parasitic capacitances encountered across different applications.

SUMMARY

Reiterating what was described above, tunability of capacitive compensation of RF circuits is highly desired and needed. Methods and devices taught in the present disclosure address such need.

According to a first aspect of the present disclosure, a A Radio Frequency (RF) circuit is provided, comprising: (i) a top node and a bottom node; (ii) a switch stack comprising a series arrangement of a plurality of transistors coupled between the top node and the bottom node; (iii) one or more tunable capacitive elements partitioned into one or more sets of tunable capacitive elements, wherein: (a) each tunable capacitive element of the one or more tunable capacitive elements comprises a first terminal, a second terminal and is configured to receive a control signal; (b) a first terminal of each transistor of the switch stack is connected to first terminals of tunable capacitive elements of a corresponding set of tunable capacitive elements of the one or more sets of tunable capacitive elements; and (c) a second terminal of each transistor of the switch stack is connected to second terminals of tunable capacitive elements of a corresponding set of tunable capacitive elements of the one or more sets of tunable capacitive elements; wherein: control signals receivable by tuning capacitive elements of the one or more tunable capacitive elements are configured to control variable capacitances across the first and the second terminals of the tunable capacitive elements of the one or more tunable capacitive elements to adjust compensating capacitances across the first and the second terminals of the transistors of the plurality of transistors, thereby compensating parasitic capacitances of the RF circuit According to a second aspect of the disclosure, a method of capacitive compensation of parasitic capacitances is provided, comprising: for each transistor of the switch stack: providing one or more tunable capacitive elements wherein each tunable capacitive element comprises a first terminal and a second terminal; connecting a first terminal of the transistor to first terminals of the tunable capacitive elements of one or more tunable capacitive elements; connecting a second terminal of the transistor to second terminals of the tunable capacitive elements of the one or more tunable capacitive elements; and tuning capacitances across the first terminals and the second terminals of the tunable capacitive elements of the one or more tunable capacitive elements, thereby adjusting a compensative capacitance across the drain-source of the transistor.

Further aspects of the disclosure are provided in the description, drawings and claims of the present application.

DESCRIPTION OF THE DRAWINGS

FIG. 3B shows an implementation of a switchable capacitive element.

FIG. 3C shows a tunable capacitive element according to an embodiment of the present disclosure.

FIG. 3D shows an equivalent circuit of the tunable capacitive element of FIG. 3C.

DETAILED DESCRIPTION

The term "OFF capacitance" of a FET transistor is referred herewith to a drain-source capacitance of the FET transistor when the transistor is in OFF state.

Figure 1:
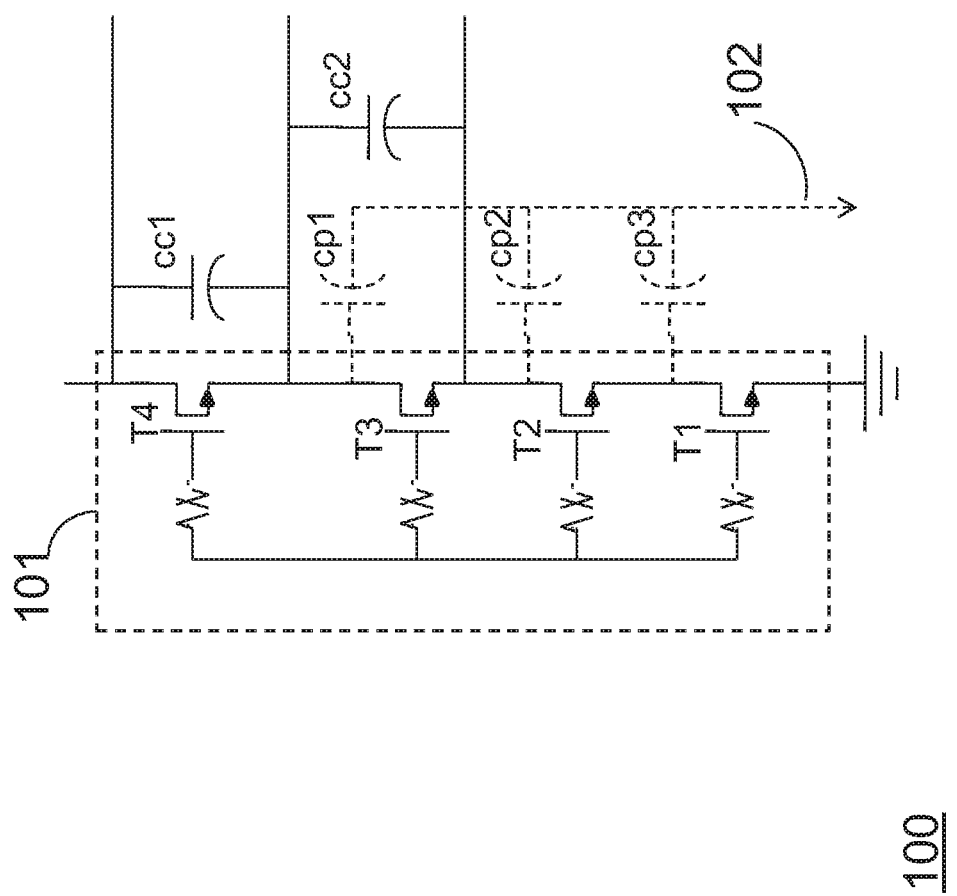
FIG. 1 shows a switch stack using hard-wired capacitive compensation as disclosed by U.S. Pat. No. 9,595,956 incorporated herein by reference in its entirety.
Figure 2A:
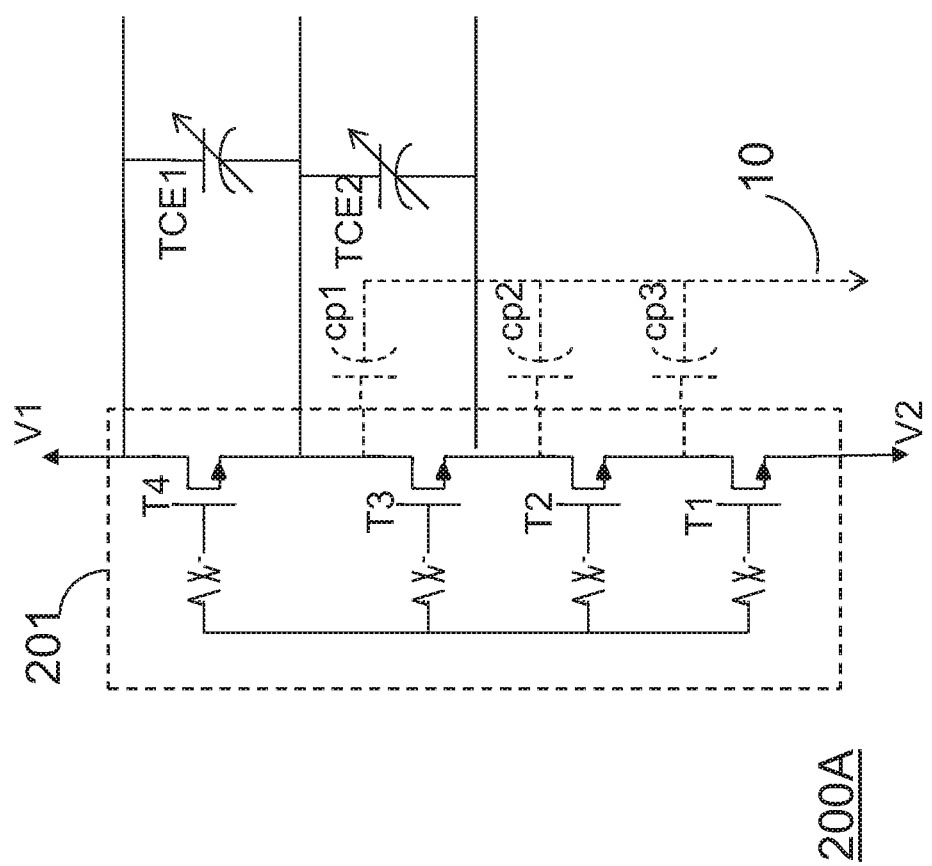
FIG. 2A shows a switch stack using tunable capacitive compensation in accordance with an embodiment of the disclosure.

FIG. 2A shows an RF circuit (200A) using tunable capacitive compensation in accordance with an embodiment of the disclosure. The RF circuit (200A) comprises a switch stack (201) and tunable capacitive elements (TCE1, TCE2). The tunable capacitive elements (TCE1, TCE2) may essentially be variable capacitors with capacitances that are tunable to desired values. The switch stack comprises transistors (T1, . . . , T4) arranged in series between a top node V1 and a bottom node V2 wherein the top transistor T1 is connected to the node V1 and the bottom transistor T4 is connected to the bottom node V2. The tunable capacitive elements (TCE1, TCE2) are coupled across drain-source of transistors (T4, T3) respectively. According to an embodiment of the disclosure, transistors (T1, . . . , T4) may be FETs. Similarly to what described with regards to FIG. 1 and depending on the designed layout of the RF circuit, parasitic capacitances (cp1, cp2, cp3) may couple from drains of corresponding transistors (T3, T2, T1) to other parts of the RF circuit (200A) including ground. The person skilled in the art will understand that a number of parasitic capacitances as shown in FIG. 2A may vary among RF circuits having switch stacks with different number of constituent transistors.

Referring back to FIG. 2A, according to an embodiment of the disclosure, the tunable capacitive elements (TCE1, TCE2) may be tuned to provide capacitances required to overcome the adverse effect of the parasitic capacitances (cp1, cp2, cp3). In other words, the tunable capacitive elements (TCE1, TCE2) may each be tuned to provide a compensation required by each of the corresponding transistors (T4, T3). It is known by the person skilled in art that in typical applications, when a switch stack is in OFF state the transistors closer to top of the stack will experience larger RF swings than the transistors closer to the bottom of the stack. The exemplary embodiment shown in FIG. 2A represents such a case and as a result, capacitive compensation has only been used for transistors (T4) and (T3), and not for transistors T2 and T1. The person skilled in the art will understand that, without departing from the scope and spirit of the invention, embodiments may also be made where tunable capacitive elements may be used across transistors located towards the bottom of the switch stack. Applications that have the signal magnitude ratio of V1 to V2 changing significantly during normal operation, such as V1/V2>>1 to V1/V2<<1, may benefit from having tunable capacitors at both top and bottom locations in the stack. Embodiments according to the present disclosure may also be envisaged wherein one or more transistors may receive capacitive compensation regardless of their position within such stack. In other embodiments in accordance with the present disclosure, one or more tunable capacitive elements may be coupled across one or more transistors of the switch stack. Other embodiments in accordance with the present disclosure, including switch stacks with any number of transistors and corresponding capacitive compensation elements may also be made.

Figure 2B:
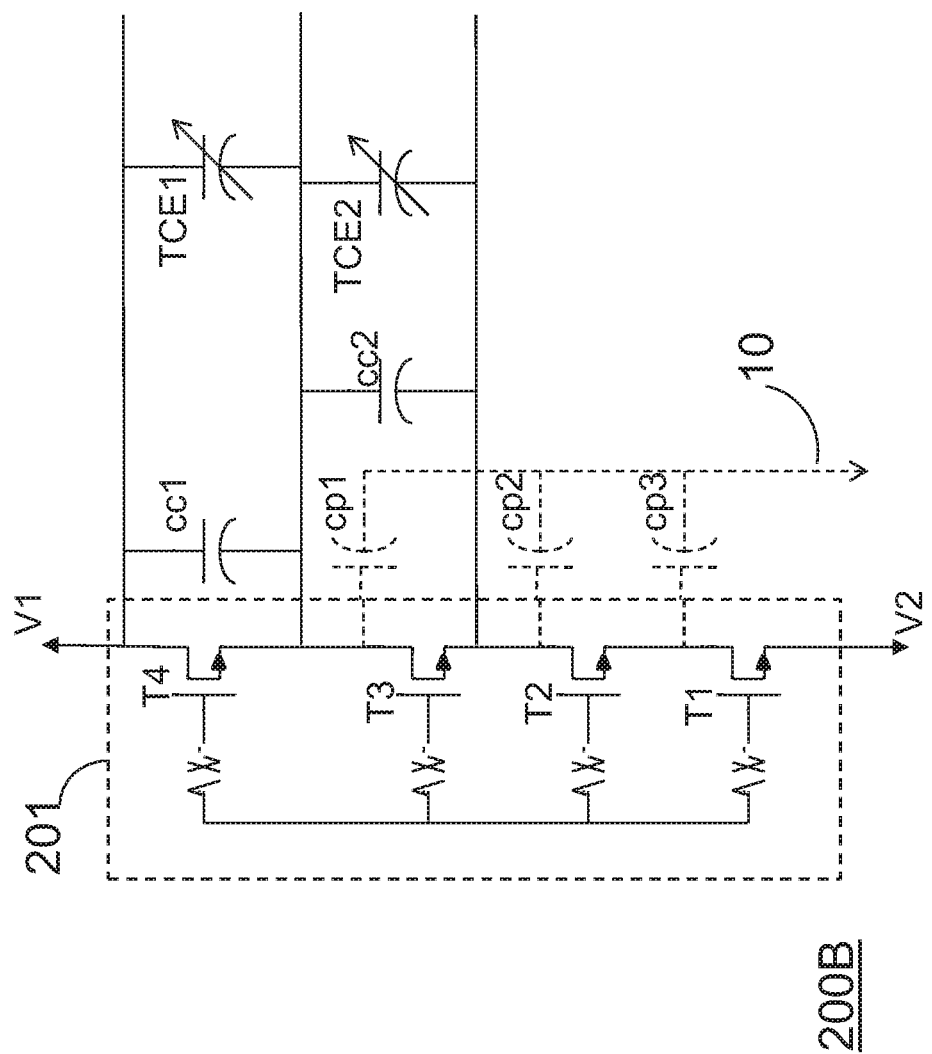
FIG. 2B shows a switch stack using a combination of hard-wired and tunable capacitive compensation in accordance with another embodiment of the disclosure.
Figure 2C:
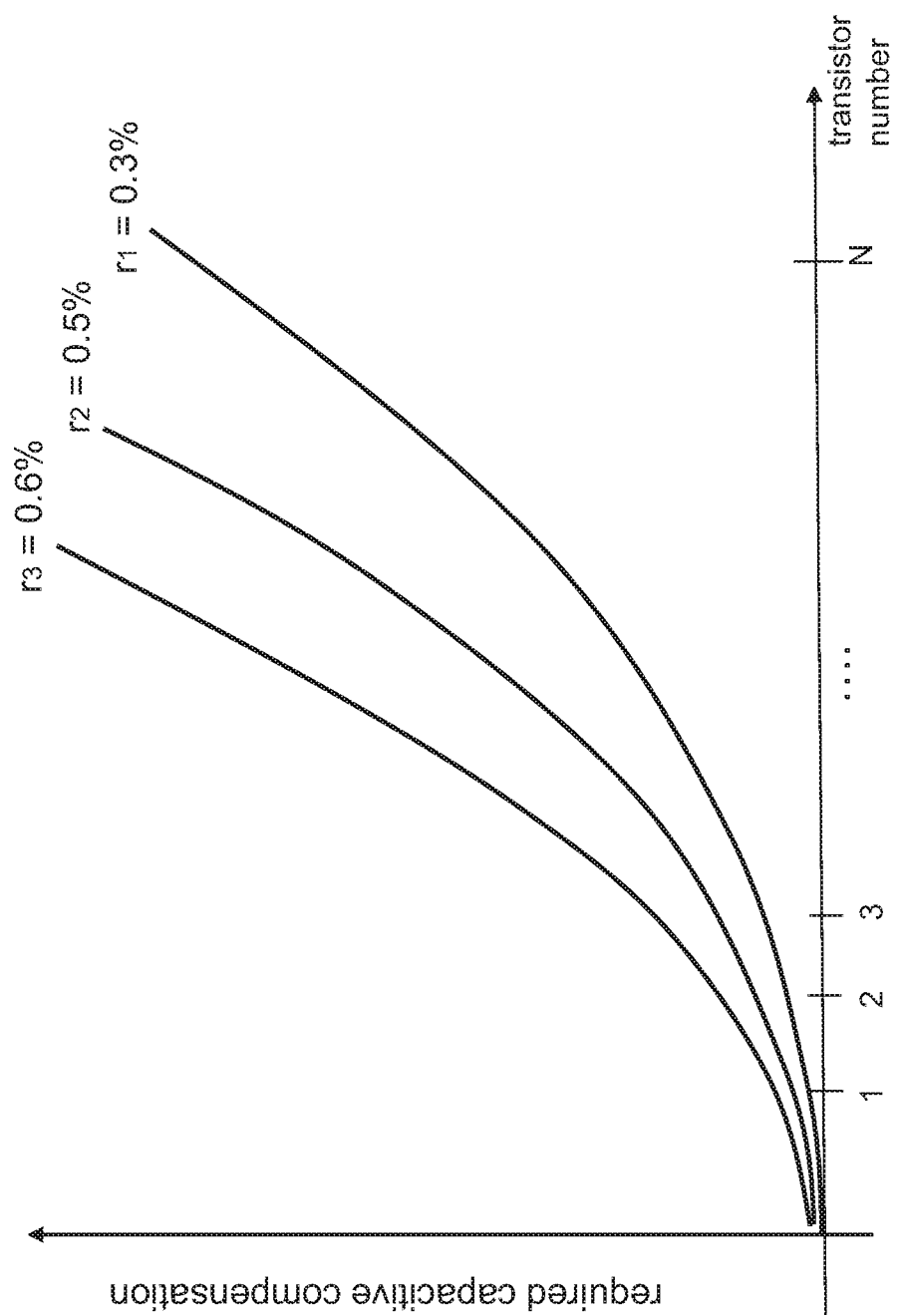
FIG. 2C shows plots of required capacitive compensation for each of the transistors in a switch stack.

Referring back to FIG. 2A, a required capacitive compensation $C_{comp}$ for each transistor within the switch stack (201) depends on a ratio $$r = \frac{C_p}{C_{OFF}}$$

wherein $C_p$ is the parasitic capacitance of the RF circuit (200A) and $C_{OFF}$ is the OFF capacitance of the transistor. According to an embodiment of the disclosure, such dependence may be represented using the following function:

$$C_{comp}(X) = \frac{1}{2}((x^2-x)r)C_{OFF}$$

wherein x represents the transistor number starting from the bottom of the switch stack (201). For example, with reference to FIG. 2A, x=1 for transistor (T1), x=2 for transistor (T2) and so on. FIG. 2C shows plots of required capacitive compensation vs. transistor number (starting from bottom of the switch stack) using the equation given above. Each of the plots corresponds to a different value of the ratio r (e.g. $r_1$=0.3%, $r_2$=0.5% and $r_3$=0.6%). As shown, the closer the transistor to the top of the stack, the higher capacitive compensation is required. Moreover, the required capacitive compensation for each transistor increases with the ratio r.

In some applications, parasitic capacitances may be large and using a combination of hard-wired and tunable capacitive compensation in accordance with the teachings of the disclosure will result in a smaller foot print in terms of layout design. In such cases, a minimum estimated parasitic capacitance may be compensated using fixed capacitances that are implemented by adding extra metal layers. Tunable compensation may additionally be implemented to compensate for parasitic variations and/or inaccuracy of the overall parasitic capacitance estimation. FIG. 2B shows an RF circuit (200B) using a combination of hard-wired and tunable capacitive compensation in accordance with an embodiment of the disclosure. The RF circuit (200B) comprises both hard-wired compensative capacitors (cc1, cc2) and tunable capacitive elements (TCE1, TCE2). The principle of operation of the RF circuit (200B) is similar to what described previously with regards to the RF circuit (200A) of FIG. 2A and the RF circuit (100) of FIG. 1.

Figure 3A:
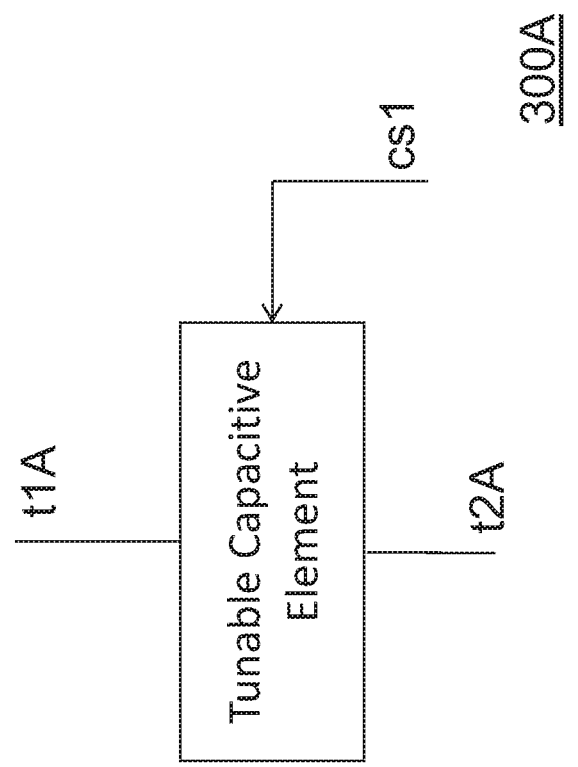
FIG. 3A shows the block diagram of a tunable capacitive element.

FIG. 3A shows a general block diagram of a tunable capacitive element (300A) according to an embodiment of the present disclosure. The tunable capacitive element (300A) comprises two terminals (t1A, t2A) and a control signal cs1. When used with a switch stack, the terminals (t1A, t2A) are used to couple the tunable capacitive element (300A) to the drain-source of a corresponding transistor in the stack. The control signal cs1 may be an output from a control circuitry (not shown) and is used to adjust a capacitance value between the two terminals (t1A, t2A). FIG. 3B shows a possible representation of a tunable capacitive element (300B) which is essentially a switchable capacitor with two states. The tunable capacitive element (300B) comprises a series arrangement of a capacitor (31) and a switch (32). A control signal cs2 is used to close/open the switch (32), thus switching the capacitor (31) in/out depending if there is or there is not a need for capacitive compensation. FIG. 3C shows a tunable capacitive element (300C) according to a further embodiment of the present disclosure. The tunable capacitive element (300C) is essentially a Metal-Oxide-Semiconductor capacitor (MOSCAP) comprising two MOSFETs (M1, M2). Gates of the MOSFETs (M1, M2) are connected together and are also coupled to a control voltage Vg through a series gate resistor Rg. Drain and source of each of the MOSFETs M1 and M2 are tied together thus providing two terminals (t1c, t2c). As such, the two terminals (t1c, t2c) are essentially coupled to each other through a series arrangement of gate-source capacitances of the two MOSFETs (M1, M2). FIG. 3D shows an equivalent circuit of the tunable capacitive element (300C) of FIG. 3C wherein the gate-source capacitances of the MOSFETs (M1, M2) are represented by capacitors (Cgs1, Cgs2) respectively. By varying the control voltage Vg, capacitance values of the gate-source capacitors can be controlled, resulting in a tunable capacitance in between the terminals (t1c, t2c). When used in a switch stack, the terminals (t1c, t2c) are used to couple the tunable capacitive element (300C) across drain-source of a corresponding transistor within the stack. The control voltage Vg may be generated using a control circuitry (not shown) in accordance with an embodiment of the present disclosure.

Figure 4:
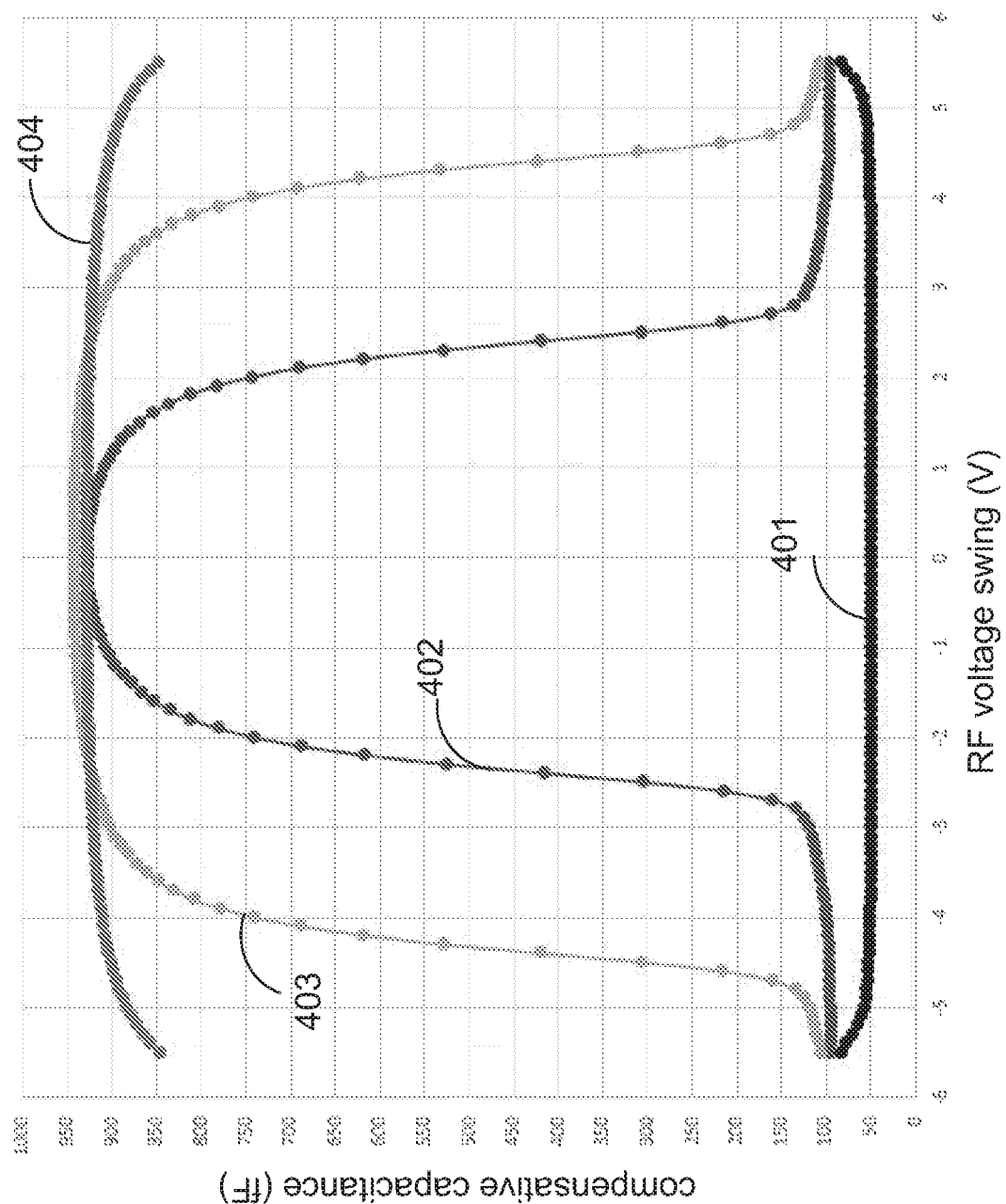
FIG. 4 shows plots of a capacitance across terminals of the tunable capacitive element of FIG. 3C. vs. RF voltage swings and for various control voltages.

FIG. 4 shows plots (401, 402, 403, 404) of compensative capacitance across the terminals (t1c, t2c) of the tunable capacitive element (300C) of FIG. 3C vs. RF voltage swing and for different values of the control voltage Vg in accordance with an embodiment of the disclosure. The plots (401, 402, 403, 404) correspond respectively to Vg=+3V, Vg=−1V, Vg=−2V, and Vg=−3V. By way of example, and not of limitation, the tunable capacitive element (300C) of FIG. 3C can function as a switchable capacitance with two states and using two control voltage values, Vg=+/−3V. Referring back to FIG. 3C, a control voltage of Vg=+3V results in a very small (around 50 fF) capacitance (almost no capacitive compensation) and a negative control voltage of Vg=−3V results in a mostly consistent compensative capacitance of around 900 fF across the RF voltage swings shown in FIG. 4.

Figure 5:
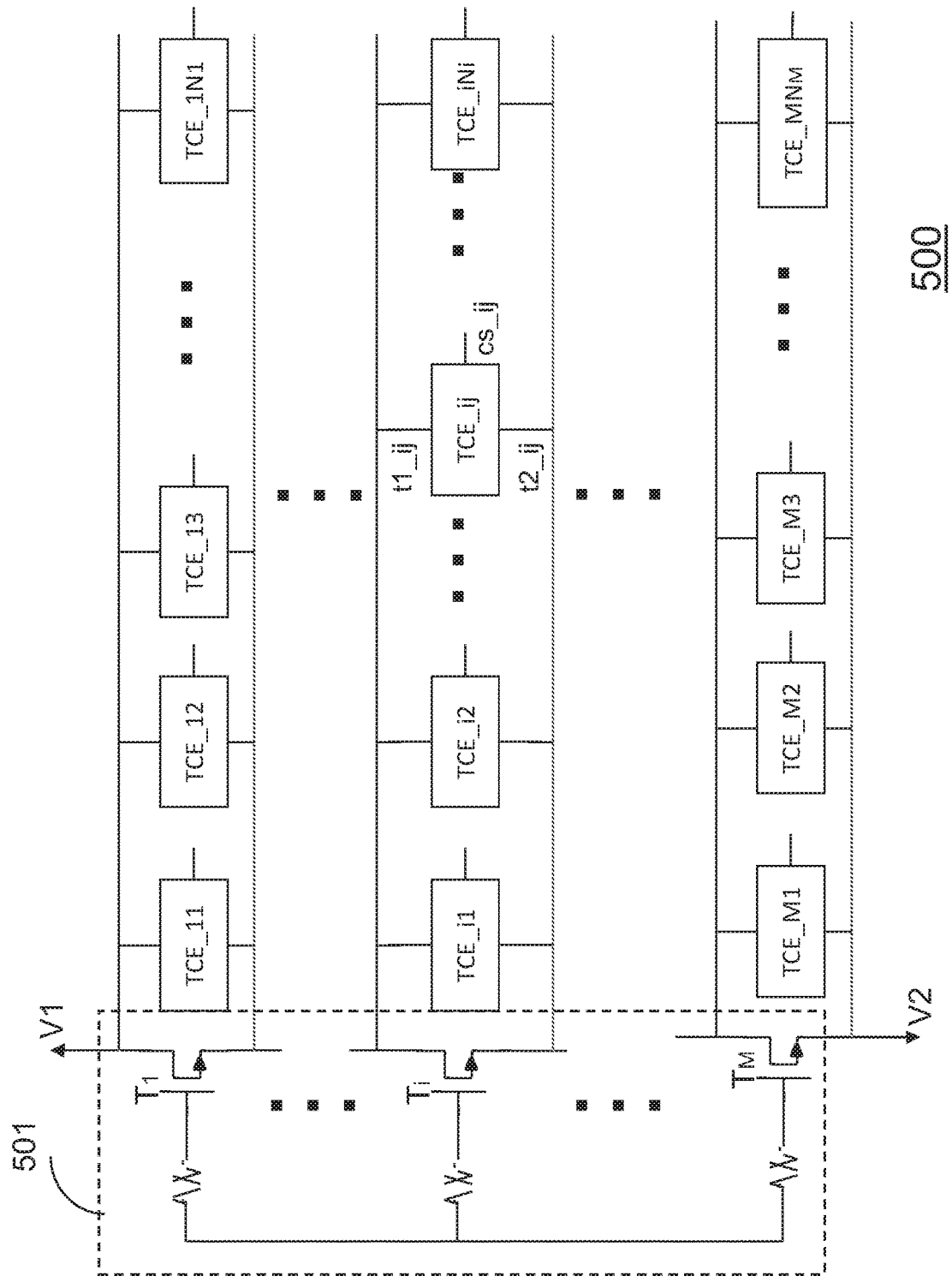
FIG. 5 shows an implementation of tunable capacitive elements for a switch stack.

FIG. 5 shows an RF circuit (500) according to an embodiment of the disclosure. The RF circuit (500) comprises a plurality of tunable capacitive elements (TCE_ij, i=1, 2, ..., M and j=1, 2, ..., Ni) and a switch stack (501) comprising a plurality of transistors (T1, i=1, 2, ..., M). Each tunable capacitive element of the plurality of the tunable capacitive elements TCE_ij (i=1, 2, ..., M and j=1, 2, ..., Ni) comprises two terminals (t1_ij, t2_ij) and a control signal cs_ij. For the sake of clarity and readability, only the terminals (t1_ij, t2_ij) and the control signal cs_ij are shown in FIG. 5. The principle of operation of each of the tunable compensating elements TCE_ij is similar to what was described with regards to the tunable compensating element (300A) of FIG. 3A. The plurality of the tunable capacitive elements (TCE_ij, i=1, 2, ..., M and j=1, 2, ..., Ni) comprises M sets of tunable capacitive elements wherein each set corresponds to a transistor of the switch FET stack (501). For example, an i-th set of tunable capacitive elements (TCE_ij, j=1, 2, ..., Ni) corresponds to transistor (T1) of the switch stack (501). In other words, each set of tunable capacitive elements associated with a particular transistor (T1) may have a distinct number of tunable capacitive elements Ni, Each element TCE_ik (k=1, 2, ..., Ni) of the i-th set of the tunable capacitive elements (TCE_ij, j=1, 2, ..., Ni) is coupled across drain-source of the corresponding transistor T1 of the switch stack (501) through terminals (t1_ik, t2_ik, k=1, 2, ..., Ni). A control signal cs_ik (k=1, 2, ..., Ni) controls a capacitance across the terminals (t1_ik, t2_ik, k=1, 2, ..., Ni) of the tunable capacitive element TCE_ik thus contributing to capacitive compensation of the corresponding transistor T1 in the stack.

Making reference to FIG. 5, and according to various embodiments of the present disclosure:

At least one set of the M sets of tunable capacitive elements have a number of tunable capacitive elements that is different from a number of tunable capacitive elements of the other sets of the M sets of the tunable capacitive elements;

All of the M sets of the tunable capacitive elements may have a same number of tunable capacitive elements;

Each set of the M sets of tunable capacitive elements have a number of tunable capacitive elements that is different from the number of tunable capacitive elements of any other set of the tunable capacitive elements;

M can be any integer greater than or equal to 1;

At least one tunable capacitive element of the plurality of the tunable capacitive elements has a control signal which is separate from control signals of the other tunable capacitive elements of the plurality of the tunable capacitive elements;

All tunable capacitive elements of the plurality of tunable capacitive elements may have the same control signal;

Each tunable capacitive element of the plurality of tunable capacitive elements may have a control signal that is separate from a control signal of any other tunable capacitive elements of the plurality of tunable capacitive elements;

Hard-wired capacitive compensation may also be implemented by coupling a fixed compensating capacitance across drain-source of at least one of the transistors of the switch stack (501);

The RF circuit (500) may be implemented on a single die; and

The control signals cs_ij (i=1, 2, ..., M and j=1, 2, ..., Ni) may be generated by a control circuitry that may or may not be implemented on the same chip as the rest of the RF circuit (500).

The person skilled in the art will understand that, depending on the application, further embodiments in accordance with the present disclosure may also be envisaged where no tunable and/or fixed capacitive compensation is implemented for at least one of the transistors in the switch stack (501). Although in some embodiments according to the present disclosure, the tunable capacitive elements of the plurality of the tunable capacitive elements are all the same, embodiments may also be provided wherein different tunable capacitive elements (based on different design parameters) are implemented.

In what follows, exemplary embodiments based on the concept disclosed with regards to the RF circuit (500) of FIG. 5 are presented.

Figure 6A:
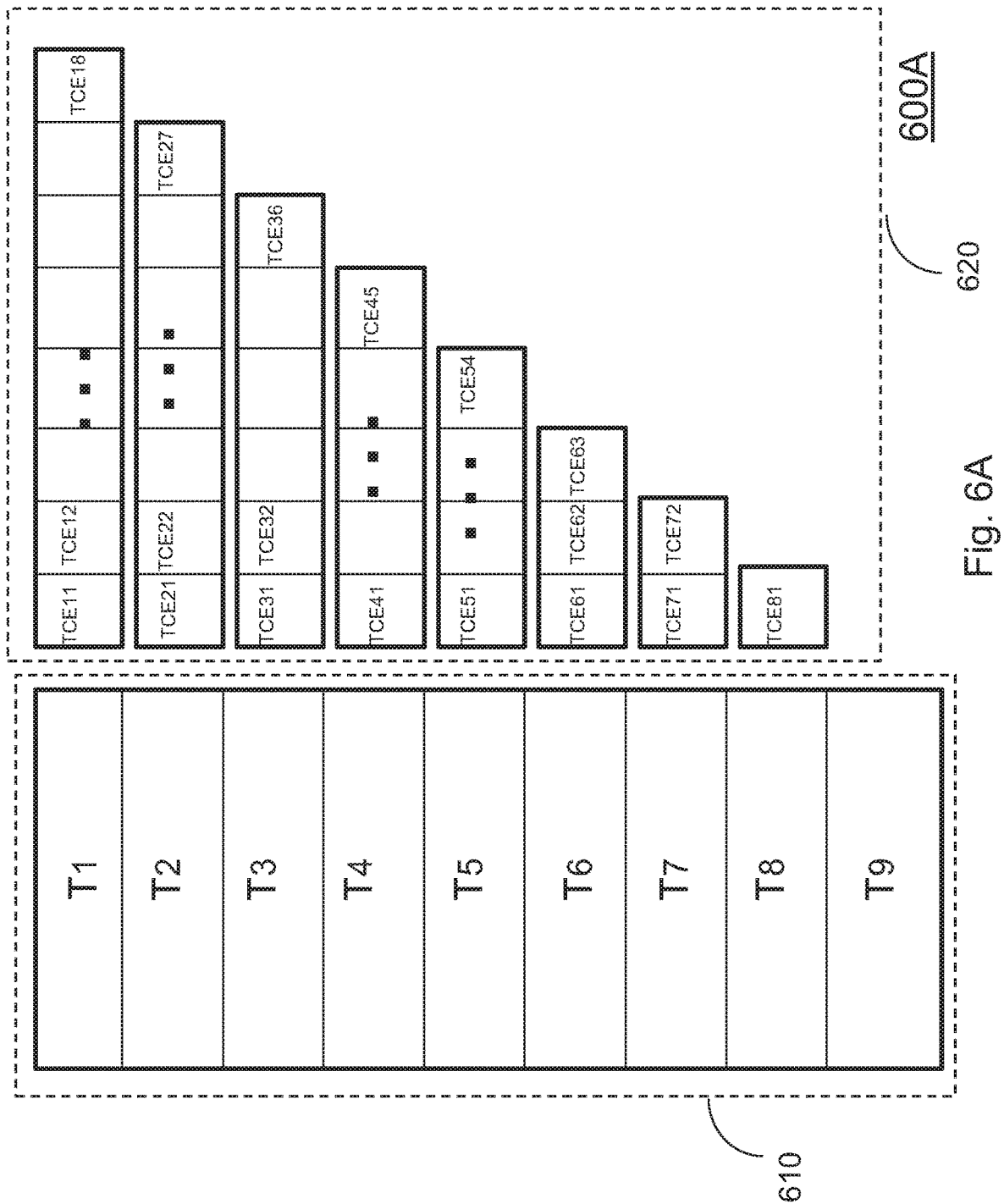
FIG. 6A shows a tapered implementation of tunable capacitive elements in accordance with an embodiment of the disclosure.

FIG. 6A shows a diagram (600A) of an RF circuit showing how a switch stack and corresponding tunable capacitive elements may be laid out on a chip in accordance with an embodiment of the disclosure. This is a simplified diagram wherein details of how various elements are interconnected are not shown as the purpose here is to show how tunable capacitive elements are structured and laid out with respect to their corresponding transistors in the stack. The diagram (600A) shows a first section (610) on a chip where transistors (T1, . . . , T9) are located. Transistors (T1, . . . , T9) form a switch stack. A second section (620) represents tunable capacitive elements (TCE_ij, i=1, . . . , 8 and j≤8) with a tapered structure and arranged in separate rows wherein each row corresponds to a transistor within the switch stack. For example, the tunable capacitive elements (TCE_41, . . . , TCE_45) correspond to and provide capacitive compensation for transistor (T4) and the tunable capacitive elements (TCE_61, TCE_62, TCE_63) correspond to and provide capacitive compensation for the transistor T6 within the switch stack. Each tunable element TCE_ij is similar to the tunable element (300A) of FIG. 3A. According to an embodiment of the present disclosure, proceeding from transistor T1 on the top to transistor T9 on the bottom of the stack, the corresponding numbers of tunable capacitive elements tapers down. For example, eight tunable capacitive elements (TCE_11, . . . , TCE_18) correspond to the transistor (T1), four tunable capacitive elements (TCE_51, . . . , TCE_54) correspond to transistor (T5) and one tunable capacitive element TCE_81 correspond to transistor (T8). No tunable capacitive element has been implemented for transistor (T9). Similarly to what was described with regards to the embodiment of FIG. 2A, a drain of the top transistor T1 is connected to a top node (not shown) and the source of the bottom transistor T9 is connected to a bottom node (not shown). The person skilled in the art will appreciate that the diagram (600A) represents a typical application wherein transistors on top of a switch stack and closer to the top node are exposed to higher RF swing compared to transistors located in the bottom of the stack (further from the top node) and as such, more capacitive compensation is dedicated to the transistors on top of the stack and closer to the top node. The person skilled in the art will also understand that further embodiments in accordance with the present disclosure may also be made wherein, proceeding from the top node to the bottom node of the switch stack, the numbers of tunable capacitive elements of the sets of tunable capacitive elements represent a sequence of numbers in non-increasing or preferably decreasing order regardless of a structure based on which the tunable capacitive elements of the plurality of tunable capacitive elements are laid out on the chip. Moreover, the non-increasing or decreasing sequence of numbers may scale according to any arbitrary trend. By way of example, and not of limitation, the decreasing order may follow a linear, or an exponential, or a logarithmic function or any other type of functions. The person skilled in the art will also appreciate that implementing a tapered structure comes with the benefit of having lower number of tunable capacitive elements on the chip which reduces the overall OFF capacitances of such elements. This is highly desired in RF circuits with stringent requirements wherein a large overall OFF capacitance may result in degradation in the RF circuit performance.

In some applications, the neighboring circuits and switches may impact the parasitic capacitance such that a compensation scheme based on a tapered structure may not be as effective. The following exemplary embodiment addresses such scenario.

Figure 6B:
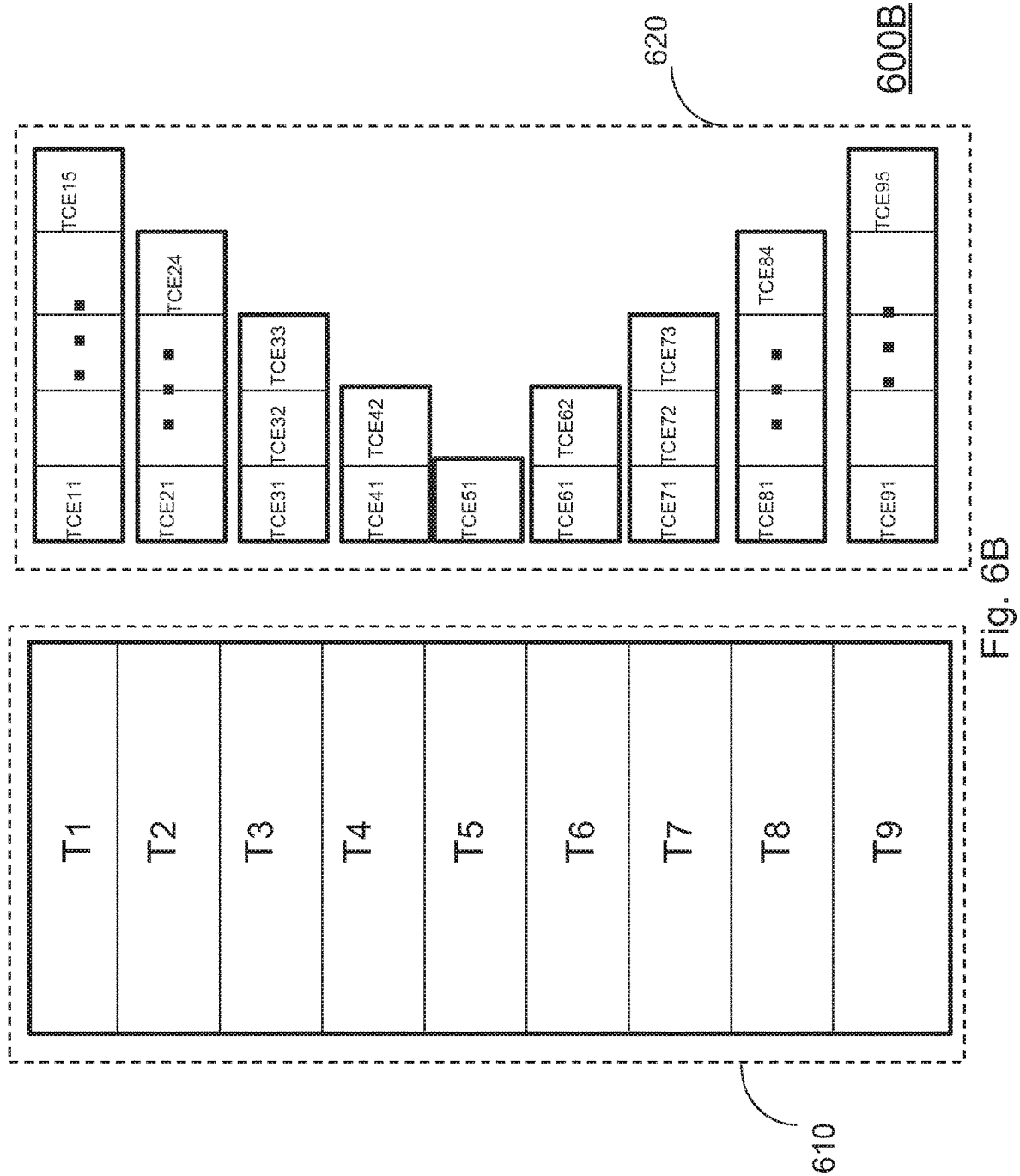
FIG. 6B shows a symmetric implementation of tunable capacitive elements according to a further embodiment of the disclosure.

FIG. 6B shows a diagram (600B) of an RF circuit, wherein tunable capacitive elements are laid out in accordance with a symmetric structure. Also shown in FIG. 6B, are a first section (610) wherein transistors schematically indicated with (T1, . . . , T9) of a switch stack reside and a second section (620) where tunable capacitive elements (TCE_ij, i=1, . . . , 9 and j≤5) are laid out. In such structure, transistors that are symmetrical with respect to a middle transistor (T5), i.e. pairs of transistors located at the same level above and below the middle transistor (T5) are associated to a corresponding same number of tunable capacitive elements. In other words, the sequence of numbers of tunable capacitive elements is symmetrical with respect to a middle transistor. For example, transistor (T2) is in the top side of the switch stack, at the level of two transistors above the middle transistor (T5) while transistor (T8) is in the bottom of the stack at the level of two transistors below the middle transistor (T5). As such, the two transistors (T5, T8) have corresponding sets of tunable capacitive elements, each set having the same number (four in this case) of tunable capacitive elements: (TCE_21, . . . , TCE_24) and (TCE_81, . . . , TCE_84). The person skilled in the art will understand that further embodiments in accordance with the present disclosure can be envisaged where a symmetric structure is also shown but without capacitive compensation applied to one (in case of the middle transistor) or more transistors within the switch stack. In accordance with embodiments of the disclosure, the tunable capacitive elements may also follow a non-symmetric architecture with respect to any of the capacitive elements. By way of example and not of limitation, the numbers of capacitive elements from top to bottom may follow sequences such as 542212333 or 5432122446 that are not symmetric with respect to any of the numbers within the sequence.

Figure 6C:
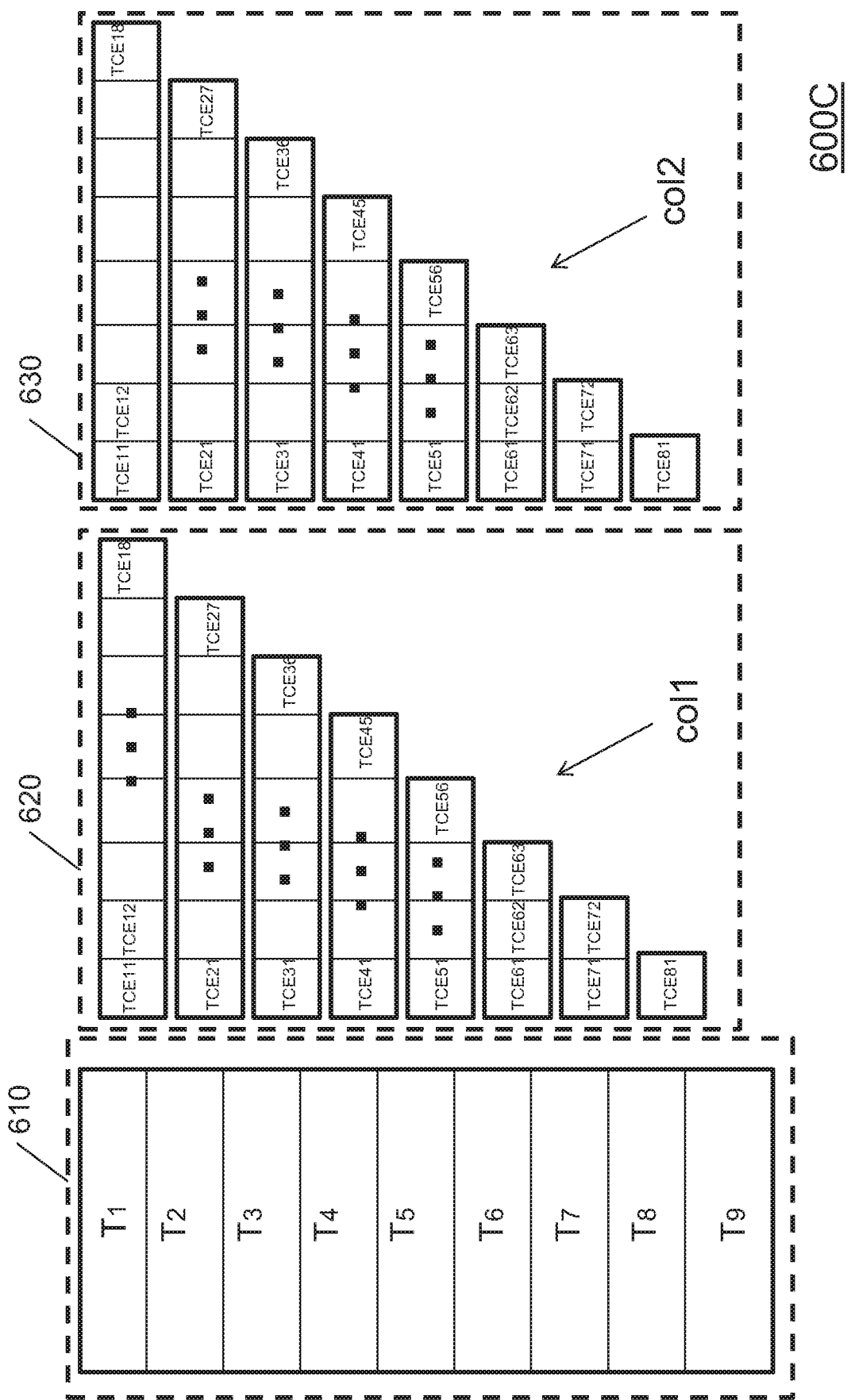
FIG. 6C shows a tapered implementation of tunable capacitive elements wherein the capacitive elements are laid out in two separately controllable columns.

According to the teachings of the disclosure, another way of adjusting to variable parasitic capacitances during operative conditions, is to implement separate sets/columns of tunable capacitive elements wherein in each column may be controlled independently and depending on how much compensation is required at each instant. FIG. 6C shows a diagram (600C) based on such concept wherein a switch stack comprising transistors (T1, . . . , T9) is implemented in a first section (610) and two columns (col1, col2) of tunable capacitive elements are laid out in a second section (620) and a third section (630) respectively. According to an embodiment of the present disclosure, two columns (col1, col2) may have separate control elements and may be switched in and out of the circuit depending on how much compensation is required during operative conditions. As an example, if a lower capacitive compensation is required, control signals of tunable capacitive elements of column (col1) may only be used for compensation and as such, tunable capacitive elements of column (col2) may be switched out using their respective control signal. At any instant where more compensation is required, the tunable capacitive elements of column col2 may be switched back into the circuit to provide for additional required capacitive compensation. The person skilled in the art will appreciate that by virtue of having separate control of different columns of tunable capacitive elements, the challenging problem of variable parasitic capacitances in RF circuits may be resolved.

Referring back to FIG. 6C and according to various embodiments of the present disclosure:
  Capacitive compensation based on any number columns of tunable capacitive elements may be implemented;
  Columns of tunable capacitive elements may be controlled together or independently;
  Tunable capacitive elements within each column may be laid out according to tapered, symmetric, other types of structure or a combination thereof; and
  A combination of hard-wired and tunable capacitive compensation may be implemented.

The person skilled in art will understand that, without departing from the spirit and scope of the disclosure, different compensation schemes may be envisaged wherein different capacitances depending on the placement of the stack of the transistors in the overall chip or circuitry may be used.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A Radio Frequency (RF) circuit comprising:
  (i) a top node and a bottom node;
  (ii) a switch stack comprising a series arrangement of a plurality of transistors coupled between the top node and the bottom node;
  (iii) one or more tunable capacitive elements partitioned into one or more sets of tunable capacitive elements, wherein:
    (a) each tunable capacitive element of the one or more tunable capacitive elements comprises a first terminal, a second terminal and is configured to receive a control signal;
    (b) tunable capacitive elements of a corresponding set of tunable capacitive elements of the one or more sets of tunable capacitive elements are connected across at least one transistor of the switch stack, wherein
    (b1) a first terminal of the at least one transistor is connected to first terminals of the tunable capacitive elements of the corresponding set of tunable capacitive elements; and
    (b2) a second terminal of the at least one transistor is connected to second terminals of the tunable capacitive elements of the corresponding set of tunable capacitive elements;
  wherein:
    control signals receivable by the tunable capacitive elements of the corresponding set of tunable capacitive elements are configured to control variable capacitances across the first and the second terminals of the tunable capacitive elements of the corresponding set of tunable capacitive elements to adjust compensating capacitances across the first and the second terminals of the at least one transistor, thereby compensating parasitic capacitances of the RF circuit.

2. The RF circuit of claim 1, wherein each tunable capacitive element of the one or more capacitive elements comprises a series arrangement of a capacitor and a switch, wherein the switch being closed or open depending on a state of the corresponding control signal.

3. The RF circuit of claim 1, wherein each tunable capacitive element of the one or more capacitive elements comprises a first Field Effect Transistor (FET) and a second FET wherein:

gates of the first and the second FET are connected to each other and coupled to the corresponding control signal via a series resistor;

a drain and a source of the first FET are tied together to provide the first terminal; and a drain and a source of the second FET are tied together to provide the second terminal.

4. The RF circuit of claim 3, wherein the control signal corresponding to the each tunable capacitive element of the one or more capacitive elements, is configured to apply a first voltage level and a second voltage level and wherein:

when the first voltage level is applied, the first and the second FETs are ON; and when the second voltage is applied, the first and the second FETs are OFF.

5. The RF circuit of claim 3, wherein the control signal corresponding to the each tunable capacitive element of the one or more capacitive elements, is configured to apply continuous voltage levels to the gates of the first and the second FETs, thereby generating continuous compensative capacitance values across drain-sources of the transistors of the plurality of transistors.

6. The RF circuit of claim 1, wherein proceeding from the top node to the bottom node, numbers of tunable capacitive elements of the one or more sets of tunable capacitive elements are in non-increasing order.

7. The RF circuit of claim 1, wherein:

the one or more sets of tunable capacitive elements comprises two or more sets of tunable capacitive elements;

the switch stack comprises M transistors, M being an integer larger than one; and for i=1, 2, ..., M, a first set of tunable capacitive elements corresponding to an i-th transistor from the top node has a same number of tuning capacitive elements as a second set of tunable capacitive elements corresponding to an i-th transistor from the bottom node.

8. The RF circuit of claim 1, wherein the one or more sets of tunable capacitive elements comprises two or more sets of tunable capacitive elements and wherein at least one set of the two or more sets of tunable capacitive elements has a number of tunable capacitive elements that is different from a number of tunable capacitive elements of the other sets of the sets of the tunable capacitive elements.

9. The RF circuit of claim 1, wherein the one or more sets of tunable capacitive elements comprises two or more sets of tunable capacitive elements and wherein all of the two or more sets of the tunable capacitive elements have a same number of tunable capacitive elements.

10. The RF circuit of claim 1, wherein the one or more sets of tunable capacitive elements comprises two or more sets of tunable capacitive elements and wherein each set of the two or more sets of tunable capacitive elements has a number of tunable capacitive elements that is different from a number of tunable capacitive elements of any other set of the tunable capacitive elements.

11. The RF circuit of claim 1, wherein the one or more tunable capacitive elements comprises a plurality of tunable capacitive elements and wherein at least one tunable capacitive element of the plurality of the tunable capacitive elements is configured to receive a control signal which is separate from control signals receivable by the other tunable capacitive elements of the plurality of the tunable capacitive elements.

12. The RF circuit of claim 1, wherein the one or more tunable capacitive elements comprises a plurality of tunable capacitive elements and wherein all tunable elements of the plurality of tunable capacitive elements are configured to receive the same control signal.

13. The RF circuit of claim 1, wherein the one or more tunable capacitive elements comprises a plurality of tunable capacitive elements and wherein each tunable capacitive element of the plurality of tunable capacitive elements is configured to receive a control signal that is separate from a control signal receivable by any other tunable capacitive elements of the plurality of tunable capacitive elements.

14. The RF circuit of claim 1, wherein hard-wired capacitive compensation is implemented by additionally coupling fixed compensating capacitors across drain-sources of at least one of the transistors of the switch stack.

15. The RF circuit of claim 1, wherein a required capacitive compensation $C_{comp}$ for each transistor within the switch stack is set according to the following equation:

$$C_{comp}(X)=\tfrac{1}{2}((x^2-x)r)C_{OFF}$$

wherein:

$$r = \frac{C_p}{C_{OFF}},$$

wherein $C_p$ is a parasitic capacitance of the RF circuit and $C_{OFF}$ is an OFF capacitance of the transistor; and x is a transistor number of the x-th transistor starting from a bottom transistor closest to the bottom node.

16. The RF circuit of claim 1, wherein the one or more tunable capacitive elements comprises a plurality of tunable capacitive elements and wherein the plurality of tunable capacitive elements is further partitioned into a plurality of columns of tunable capacitive elements wherein:

control signals applicable to tunable capacitive elements of each column of tunable capacitive elements are tied together to provide a column control signal;

the column control signal applicable to each column of tunable capacitive elements is separate from column control signals applicable to the other columns of tunable capacitive elements; and each column of tunable capacitive elements has a subset of tunable capacitive elements of each set of tunable capacitive elements.

17. The RF circuit of claim 16, wherein all columns of tunable capacitive elements are the same and are laid out on a chip according to a same structure.

18. The RF circuit of claim 16, wherein within each column of tunable capacitive elements and proceeding from the top node the bottom node, numbers of tunable capacitive elements of the subsets of tunable capacitive elements represent a sequence of numbers in non-increasing order.

19. A method of capacitive compensation of parasitic capacitances comprising the steps of:

providing a switch stack comprising a plurality of transistors;

for at least one transistor of the switch stack:

providing one or more tunable capacitive elements wherein each tunable capacitive element comprises a first terminal and a second terminal;

partitioning the one or more tunable capacitive elements into one or more sets of tunable capacitive elements;

connecting tunable capacitive elements of a corresponding set of tunable capacitive elements of the one or more sets of tunable capacitive elements across the at least one transistor of the switch stack;

connecting a first terminal of the at least one transistor to first terminals of the tunable capacitive elements of the corresponding set of tunable capacitive elements of the one or more tunable capacitive elements;

connecting a second terminal of the at least one transistor to second terminals of the tunable capacitive elements of the corresponding set of tunable capacitive elements of the one or more tunable capacitive elements; and tuning capacitances across the first terminals and the second terminals of the tunable capacitive elements of the corresponding set of tunable capacitive elements the one or more tunable capacitive elements, thereby adjusting a compensative capacitance across the first terminal and the second terminal of the at least one transistor.

20. The method of claim 19, further comprising a step of providing control signals for the tunable capacitive elements of the corresponding set of capacitive elements of the one or more tunable capacitive elements and wherein the step of tuning capacitances across the first terminals and the second terminals of the tunable capacitive elements is executed using the control signals.

21. The RF circuit of claim 1, implemented on a single die or chip.

22. The RF circuit of claim 21, wherein the control signals are provided by a control circuitry on the same die.

23. The RF circuit of claim 21, wherein the control signals are provided by a control circuitry that is not on the same die.

24. The RF circuit of claim 3, wherein the first FET and the second FET are MOSFETs.

25. The RF circuit of claim 1, wherein the transistors of the switch stack are MOSFETs.

26. The RF circuit of claim 1, wherein the one or more tunable capacitive elements comprises a plurality of tunable capacitive elements and wherein the tunable capacitive elements of the plurality of tunable capacitive elements are all the same.

27. The RF circuit of claim 1, wherein the one or more tunable capacitive elements comprises a plurality of tunable capacitive elements and wherein at least one tunable capacitive element of the plurality of tunable capacitive elements is different from other tunable capacitive elements of the plurality of tunable capacitive elements.

28. The RF circuit of claim 1, wherein the one or more sets of tunable capacitive elements comprises two or more sets of tunable capacitive elements and wherein proceeding from the top node to the bottom node, numbers of tunable capacitive elements of the two or more sets of tunable capacitive elements are in decreasing order.

* * * * *